(12) United States Patent
Watanabe et al.

(10) Patent No.: US 7,577,058 B2
(45) Date of Patent: Aug. 18, 2009

(54) SEMICONDUCTOR DEVICE HAVING INPUT DETECTION CIRCUIT WHICH OPERATES IN A SYNCHRONOUS OPERATION AND AN ASYNCHRONOUS OPERATION

(75) Inventors: Toshifumi Watanabe, Yokohama (JP); Shigefumi Ishiguro, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 237 days.

(21) Appl. No.: 11/774,919

(22) Filed: Jul. 9, 2007

(65) Prior Publication Data
US 2008/0007303 A1      Jan. 10, 2008

(30) Foreign Application Priority Data
Jul. 10, 2006     (JP)     ............... 2006-189695

(51) Int. Cl.
*G11C 8/00*     (2006.01)
(52) U.S. Cl. .................... 365/233.1; 365/194
(58) Field of Classification Search .............. 365/233.1, 365/194
See application file for complete search history.

(56) References Cited

U.S. PATENT DOCUMENTS

| | | | | |
|---|---|---|---|---|
| 5,926,434 A | * | 7/1999 | Mori | ............... 365/233.14 |
| 5,946,247 A | * | 8/1999 | Osawa et al. | ............... 365/201 |
| 6,310,818 B1 | * | 10/2001 | Mukai | ............... 365/230.05 |
| 6,741,515 B2 | * | 5/2004 | Lazar et al. | ............... 365/222 |
| 6,781,909 B2 | * | 8/2004 | Kurita | ............... 365/222 |
| 6,813,211 B2 | | 11/2004 | Takatsuka et al. | |

FOREIGN PATENT DOCUMENTS

JP     11-238389     8/1999

* cited by examiner

*Primary Examiner*—Tuan T. Nguyen
(74) *Attorney, Agent, or Firm*—Oblon, Spivak, McClelland, Maier & Neustadt, P.C.

(57) ABSTRACT

A semiconductor device includes a first input terminal, the first input terminal being supplied with an input signal, an input detection circuit including a delay circuit having a second input terminal and an output terminal, the input detection circuit detecting a shift in the input signal and generating a first pulse signal in response to the shift, the input detection circuit being connected to the first input terminal, and a control circuit for generating control signals, each of the control signals being generated in response to a synchronous operation or an asynchronous operation respectively.

20 Claims, 11 Drawing Sheets

SEMICONDUCTOR DEVICE HAVING INPUT DETECTION CIRCUIT WHICH OPERATES IN A SYNCHRONOUS OPERATION AND AN ASYNCHRONOUS OPERATION

CROSS REFERENCE TO RELATED APPLICATION

This application is based on and claims the benefit of priority from the prior Japanese Patent Application No. 2006-189695, filed on Jul. 10, 2006, the entire contents of which are incorporated herein by reference.

BACKGROUND OF THE INVENTION

1. Field of the Invention

The present invention is related to a semiconductor device. Specifically, it is related to an input detection circuit applied to a semiconductor device which operates in a synchronous operation and an asynchronous operation.

2. Description of the Related Art

A semiconductor device which operates in the synchronous operation and the asynchronous operation, for example, as shown in Japanese Laid Open Patent 11-238389, includes an input detection circuit used in the asynchronous operation. The input detection circuit detects a shift in an input signal in the asynchronous operation and generates a pulse signal in accordance with the shift. However, because the input detection circuit also operates in the synchronous operation, an unnecessary amount of energy is consumed.

BRIEF SUMMARY OF THE INVENTION

A semiconductor device according to one embodiment of the present invention comprises a first input terminal, the first input terminal being supplied with an input signal, an input detection circuit including a delay circuit having a second input terminal and an output terminal, the input detection circuit detecting a shift in the input signal and generating a first pulse signal in response to the shift, the input detection circuit being connected to the first input terminal, and a control circuit for generating control signals, each of the control signals being generated in response to a synchronous operation or an asynchronous operation respectively A semiconductor device according to one embodiment of the present invention comprises a first input terminal, the first input terminal being supplied with an input signal, an input detection circuit including a delay circuit having a second input terminal and an output terminal and a signal generation circuit connected to the second input terminal and the output terminal, the signal generation circuit generating a first pulse signal, the input detection circuit detecting a shift in the input signal and generating a second pulse signal in response to the shift, the input detection circuit being connected to the input terminal, and a control circuit for generating control signals, each of the control signals being generated in response to a synchronous operation or an asynchronous operation respectively.

BRIEF DESCRIPTION OF THE DRAWINGS

FIG. 2(a) is one example of an input detection circuit of the present invention and (b) is one example of an inverter 22 of an input detection circuit of the present invention.

DETAILED DESCRIPTION OF THE INVENTION

Figure 9:
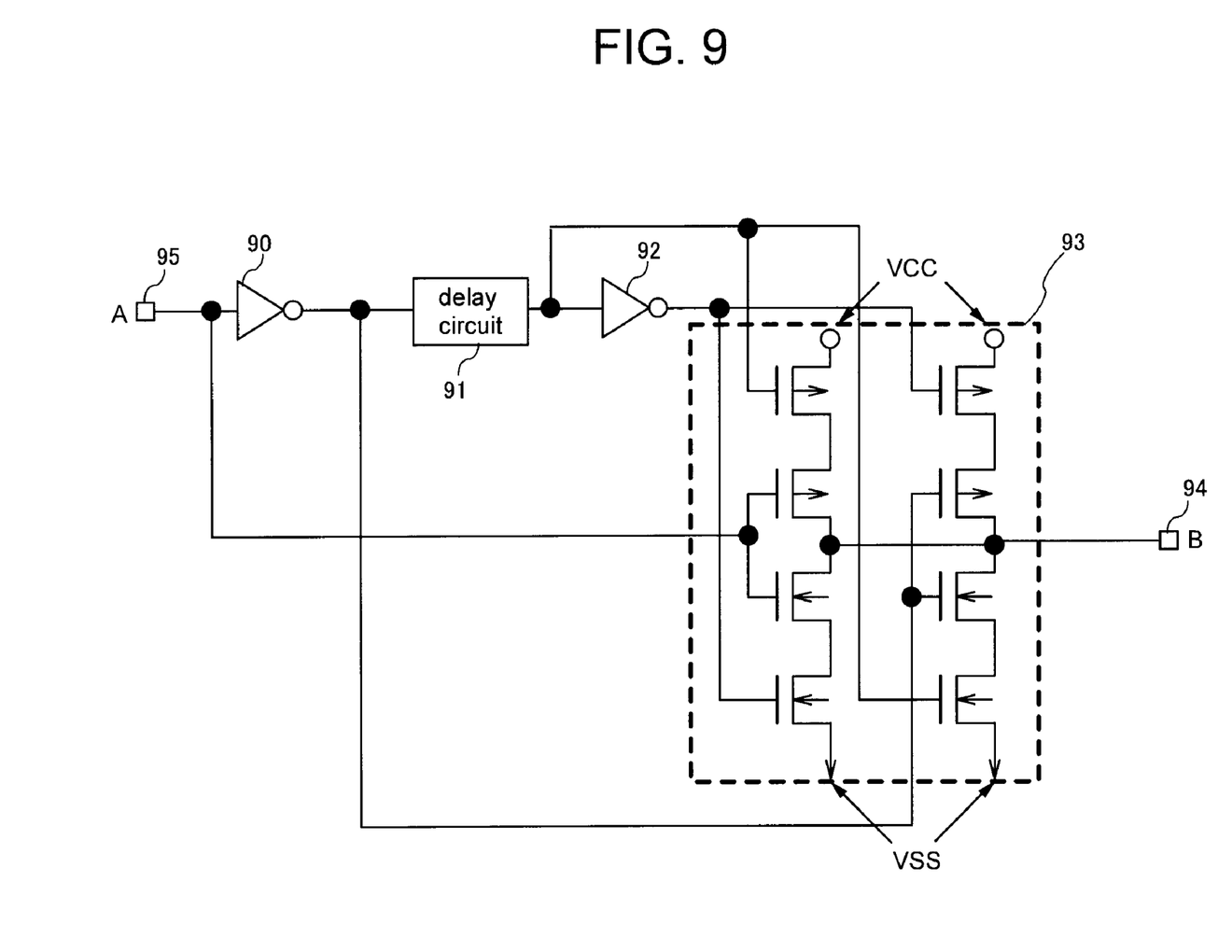
FIG. 9 is a circuit diagram of a general input detection circuit.

FIG. 9 shows a general input detection circuit. As is shown in FIG. 9, the general input detection circuit includes an inverter 90, a delay circuit 91, an inverter 92, a signal generation circuit 93 which has a plurality of MOS transistors, an input terminal 95 and a driver 94.

Figure 10:
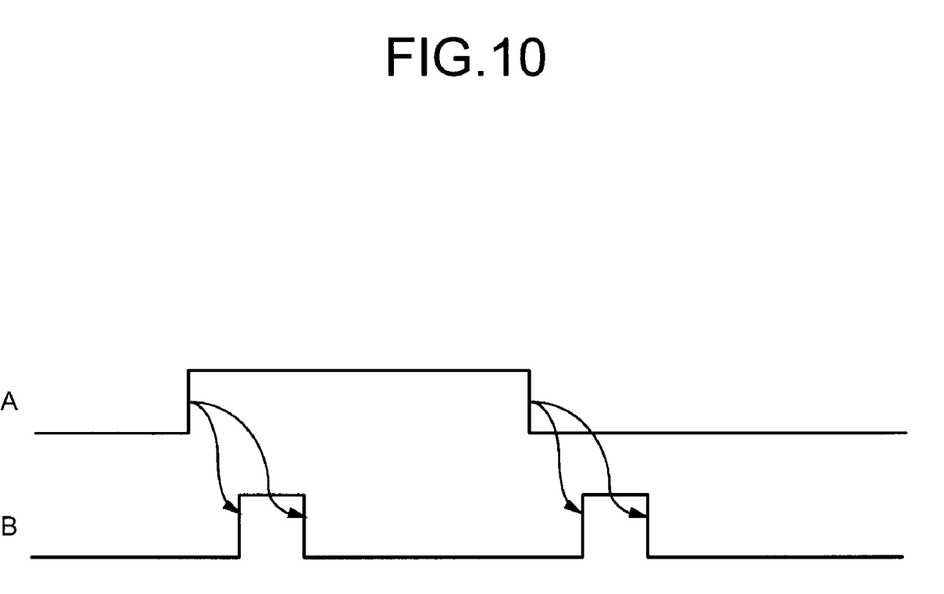
FIG. 10 is a timing chart of a general input detection circuit.

FIG. 10 is a timing chart of an input signal A and an output signal B of the general input detection circuit. Hereinafter, the operation of the general input detection circuit is briefly explained.

In FIG. 9, when the input signal A is supplied to the input terminal 95 of the input detection circuit, a signal is transmitted to the signal generation circuit 93 passing through the inverter 90, 92 and the delay circuit 91. The conduction state of each MOS transistor within the signal generation circuit 93 is decided by the level of the signal which is transmitted, and the output signal B is output to the driver 94 from the input detection circuit.

As shown in FIG. 10, for example, when the input signal A shifts from L (low level) to H (high level) or from H to L, the output signal B is output as a short pulse. When the semiconductor device is set in the asynchronous operation, the output signal B acts as a trigger and the semiconductor device starts each internal operation.

Alternatively, in the synchronous operation, because the semiconductor device operates in synchrony with an external clock, which is not shown in the drawings, the input detection circuit is not required. However, because the input of the input detection circuit is commonly connected to an address input terminal etc, the input detection circuit operates regardless of the asynchronous or the synchronous operation. Hereinafter, "input" means "input terminal" and "input node" collectively. As a result, an unnecessary amount of current flows through the input detection circuit during the synchronous operation and this is linked to a considerable increase in power consumption.

According to one embodiment of the present invention, it is possible to stop flowing of through current in the delay circuit within the input detection circuit during the synchronous operation, by a control signal which is generated from a control circuit. As a result, it is possible to reduce power consumption during the synchronous operation.

Hereinafter, one embodiment of the present invention is explained referring to FIG. 1 to FIG. 8. However, the present invention is not limited to the following embodiment.

Figure 1:
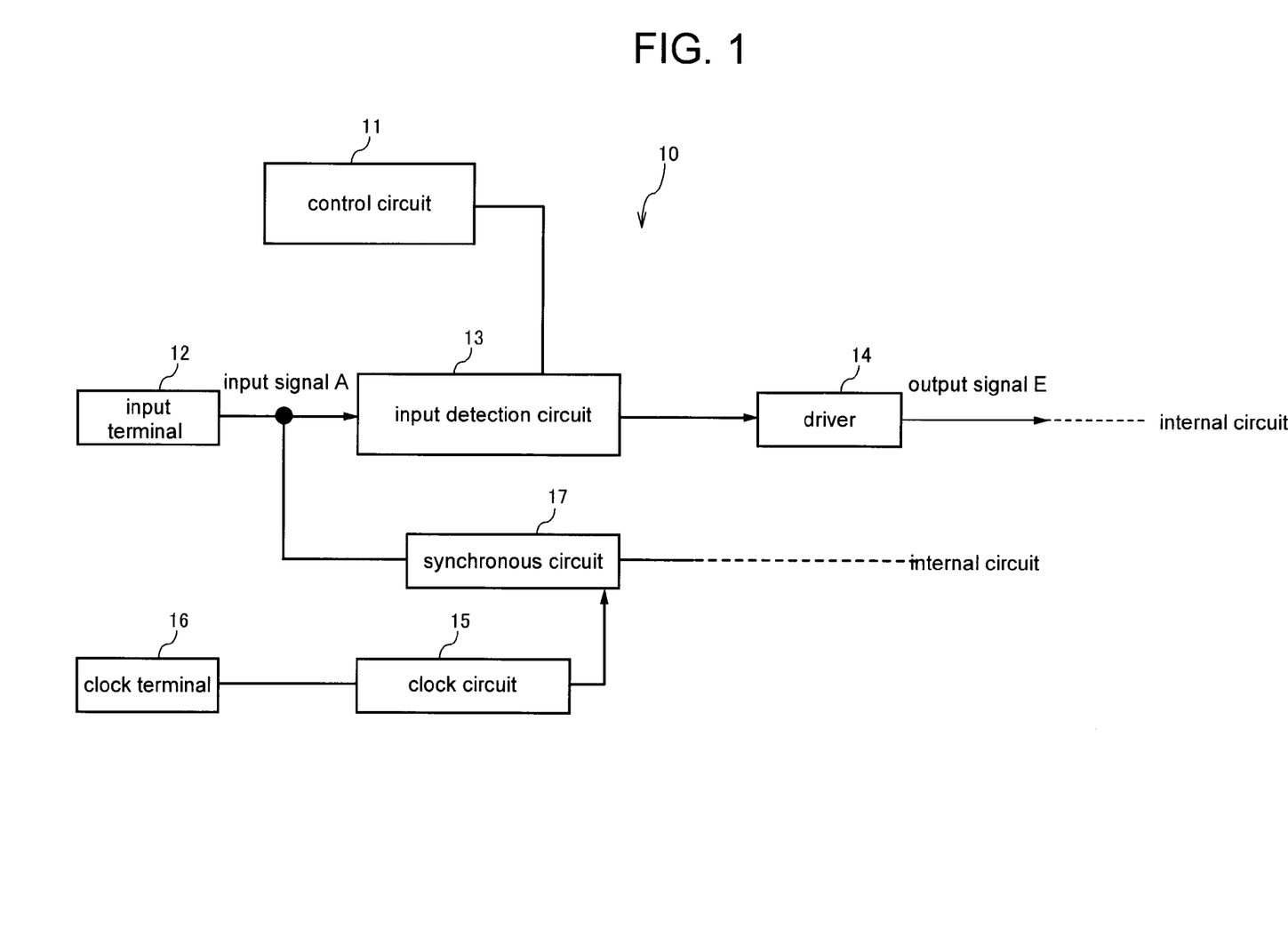
FIG. 1 is a block diagram which shows one embodiment of the present invention.

FIG. 1 is a block diagram which shows a semiconductor memory device 10 of one embodiment of present invention. The semiconductor memory device 10 includes a control circuit 11, an input terminal 12, an input detection circuit 13 and a driver 14. This input detection circuit 13 has an output.

Hereinafter, "output" means "output terminal" and "output node" collectively. The output of the input detection circuit outputs an output signal E.

The semiconductor memory device 10 includes a memory cell array and each variety of circuit such as a sense amp which are not shown in the drawing in order to conduct a data memory operation in a semiconductor memory device. In addition, an address signal is supplied to the input terminal 12.

The semiconductor memory device 10 further includes a clock terminal 16 which receives a clock signal CLK, a clock circuit 15 which generates an internal clock signal in response to the CLK signal, and a synchronous circuit 17 which operates in accordance with the internal clock signal. The synchronous circuit 17 receives the address signal which is supplied to the input terminal 12 and operates in accordance with the address signal.

In this way, the semiconductor memory device 10 operates in a two operational mode, that is, the synchronous operation and the asynchronous operation.

The control circuit 11 generates a control signal C which has different two levels depending on the synchronous operation or the asynchronous operation. The control signal C is H during the synchronous operation and L during the asynchronous operation.

The input detection circuit 13 is connected to the input terminal 12 and includes a delay circuit which has an input and an output inside. The input detection circuit 13 detects a shift in the input signal A and generates a pulse signal in accordance with the shift.

When the control signal C is L, that is, in the asynchronous operation, the input detection circuit 13 operates normally and outputs a pulse signal to the driver 14 in accordance with the shift in the input signal A. However, when the control circuit C is H, that is, in the synchronous operation, the operation of the input detection circuit 13 stops. Therefore, a pulse signal is not output even if the input signal A shifts. As a result, power consumption in the input detection circuit 13 operation is reduced during the synchronous.

Furthermore, the input signal A is processed by the synchronous circuit 17 in accordance with the internal clock signal output by the clock circuit 15 during the synchronous operation.

FIGS. 2(a) and (b) are detailed circuit construction diagrams of the input detection circuit 13 in one embodiment of the present invention. As shown in FIGS. 2(a) and (b), the input detection circuit 13 includes a clocked inverter 20, a delay circuit 21, a feedback circuit 29, and an inverter 25, a signal generation circuit 28, an output fixed circuit 30 and an inverter 22. The input of the inverter 22 shown in FIG. 2(b) receives the control signal C. The output of the inverter 22 is supplied to the clocked inverter 20, a clocked inverter 24 of the feedback circuit 29 and a 2-input NAND gate 26 of the output fixed circuit 30. The clocked inverter 20 is connected to the input terminal 12.

Figure 3A:
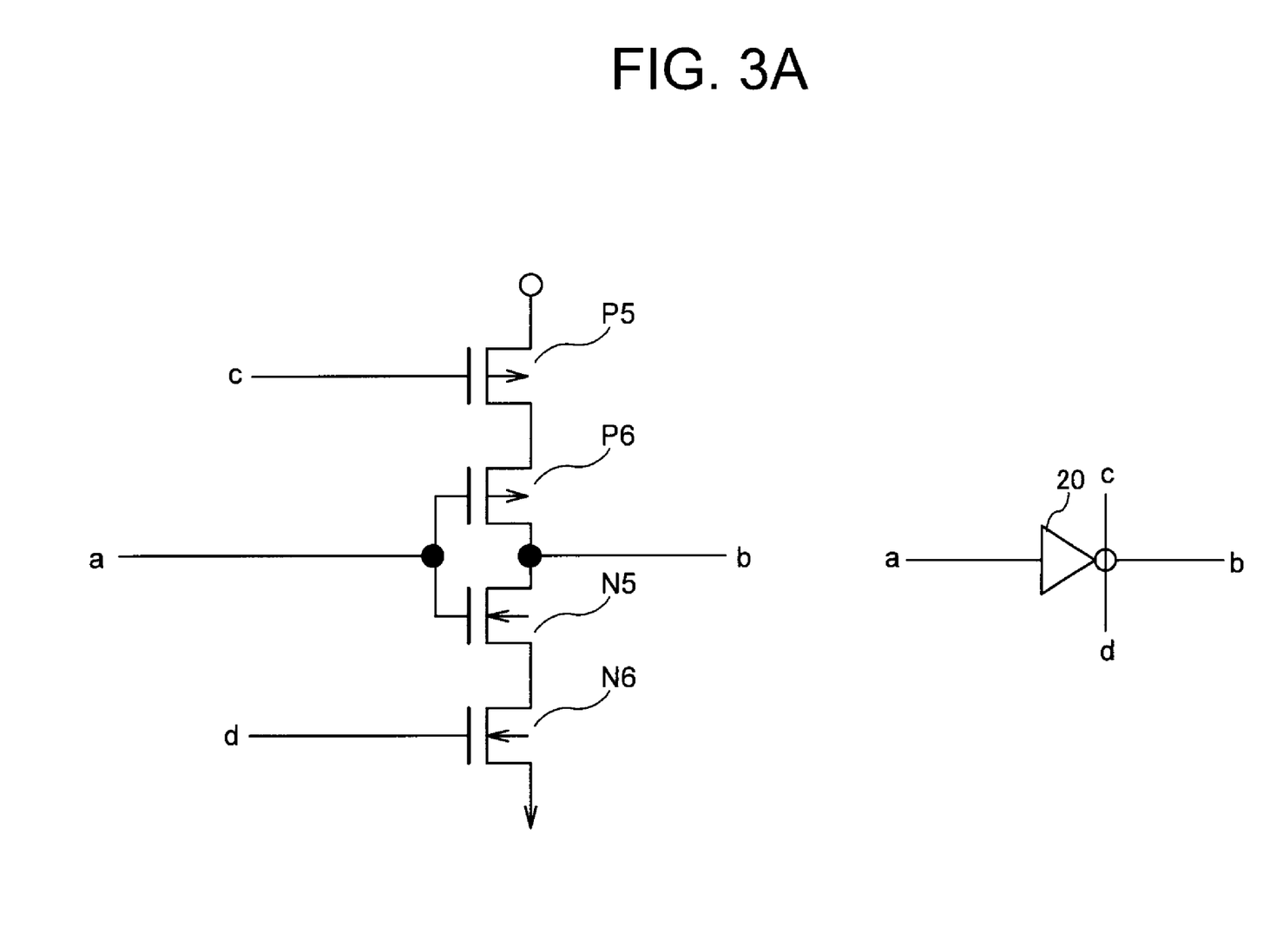
FIG. 3A shows a circuit construction of a clock inverter 20.

The circuit construction details of the clocked inverter 20 are as is shown in FIG. 3 A. The clocked inverter 20 is comprised of a P type MOS transistor P5, P6 and an N type MOS transistor N5 and N6 which are connected in series between a power supply and a ground. A gate of the P type MOS transistor P6 and a gate of the N type MOS transistor N5 are commonly connected and a signal a is applied to the gate. A signal c is applied to the gate (inversion control terminal) of the P type MOS transistor P5 and a signal d is applied to the gate (control terminal) of the N type MOS transistor N6. An output b of the clocked inverter 20 is a common connection terminal which is commonly connected to the P type MOS transistor P6 and the N type MOS transistor N5.

The control signal C is supplied to the inversion control terminal of the clocked inverter 20 and the inverted control signal D is supplied to the control terminal. Therefore, because the signal C is L and the signal D is H during the asynchronous operation, the clocked inverter 20 operates as an inverter. And because the signal C is H and the signal D is L during the synchronous operation, the clocked inverter 20 does not operate as an inverter and the output is a high-impedance state. The output of the clocked inverter 20 is connected to the input of the delay circuit 21.

Figure 3B:
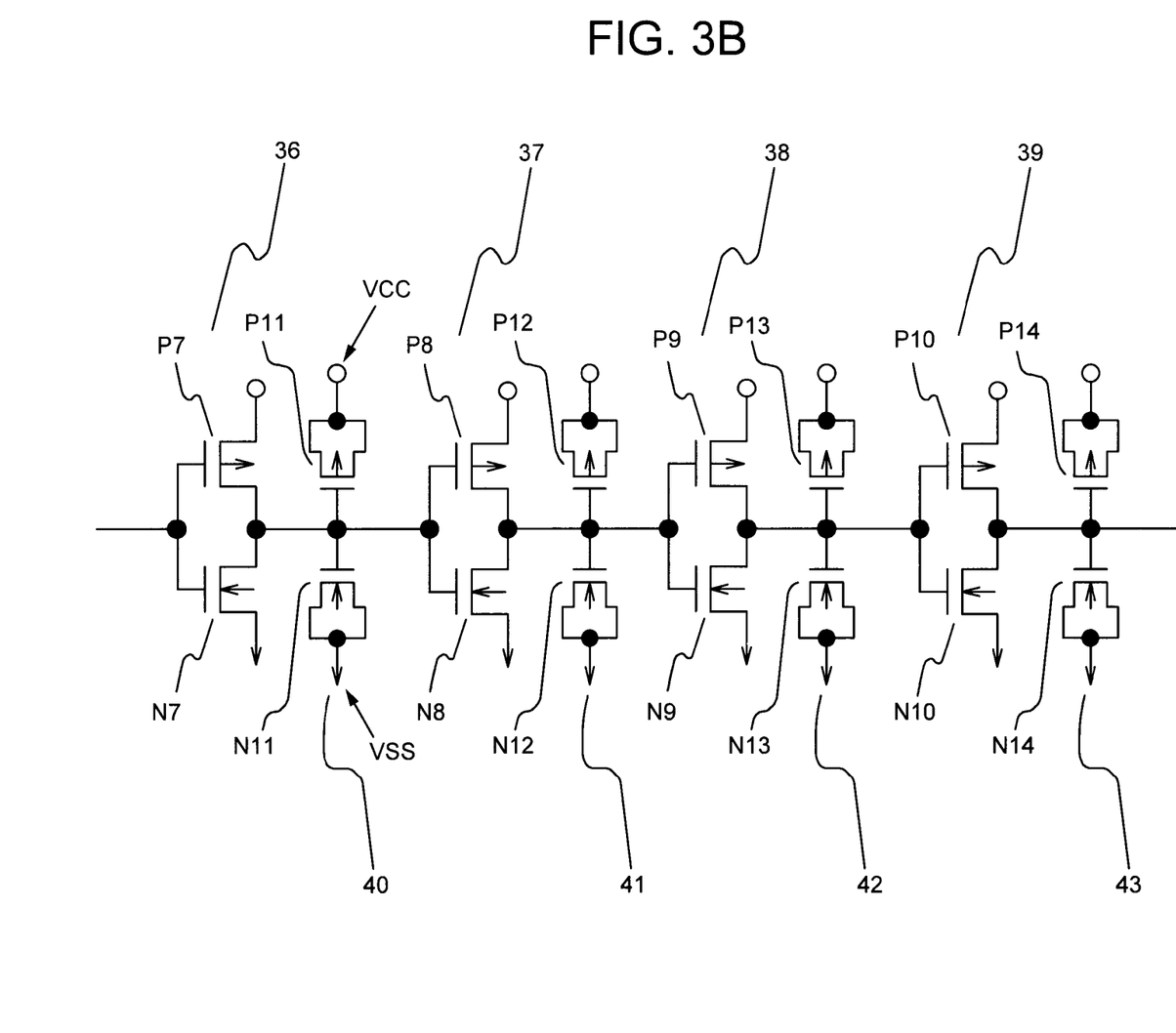
FIG. 3B shows one example of a circuit construction of a delay circuit 21.

One example of the details of the circuit construction of the delay circuit 21 is as shown in FIG. 3 B. The delay circuit 21 includes a plurality of inverters 36 to 39 a plurality of capacitors 40 to 43. The output of the inverter 36 is connected to the input of the inverter 37, the output of the inverter 37 is connected to the input of the inverter 38 and the output of the inverter 38 is connected to the input of the inverter 39. A capacitor 40 is connected to the connection node between the output of the inverter 36 and the input of the inverter 37, a capacitor 41 is connected to the connection node between the output of the inverter 37 and the input of the inverter 38, a capacitor 42 is connected to the connection node between the output of the inverter 38 and the input of the inverter 39 and a capacitor 43 is connected to the output of the inverter 39. The inverter 36 is comprised of a P type MOS transistor P7 and an N type MOS transistor N7 connected in series. Similarly, the inverter 37 is comprised of a P type MOS transistor P8 and an N type MOS transistor N8 connected in series, the inverter 38 is comprised of a P type MOS transistor P9 and an N type MOS transistor N9 connected in series and the inverter 39 is comprised of a P type MOS transistor P10 and an N type MOS transistor N10 connected in series. In addition, the capacitor 40 is comprised of a P type MOS transistor P11 and an N type MOS transistor N11 connected in parallel. Similarly, the capacitor 41 is comprised of a P type MOS transistor P12 and an N type MOS transistor N12 connected in parallel, the capacitor 42 is comprised of a P type MOS transistor P13 and an N type MOS transistor N13 connected in parallel and the capacitor 43 is comprised of a P type MOS transistor P14 and an N type MOS transistor N14 connected in parallel. The diffusion regions of the P type MOS transistors P11 to P14 are connected to a power voltage and the diffusion regions of the N type MOS transistors N11 to N14 are connected to a ground voltage respectively. The gate of the P type MOS transistor P11 and the gate of the N type MOS transistor N11 are connected to the output node of the inverter 36. Similarly, the gate of the P type MOS transistor P12 and the gate of the N type MOS transistor N12 are connected to the output node of the inverter 37, the gate of the P type MOS transistor P13 and the gate of the N type MOS transistor N13 are connected to the output node of the inverter 38 and the gate of the P type MOS transistor P14 the gate of the N type MOS transistor N14 are connected to the output node of the inverter 39 respectively. The channel capacity of the P type MOS transistor P11 and the channel capacity of the N type MOS transistor N11 which are connected to the output node of the inverter 36 work as a capacitor. Similarly, the channel capacity of the P type MOS transistor P12 and the channel capacity of the N type MOS transistor N12 which are connected to the output node of the inverter 37 work as a capacitor, the channel capacity of the P type MOS transistor P13 and the channel capacity of the N type MOS transistor N13 which are connected to the output node of the inverter 38 work as a capacitor and the channel capacity of the P type MOS transistor P14 and the channel capacity of the N type MOS transistor N14 which are connected to the output node of the inverter 39 work as a capacitor.

Figure 2:
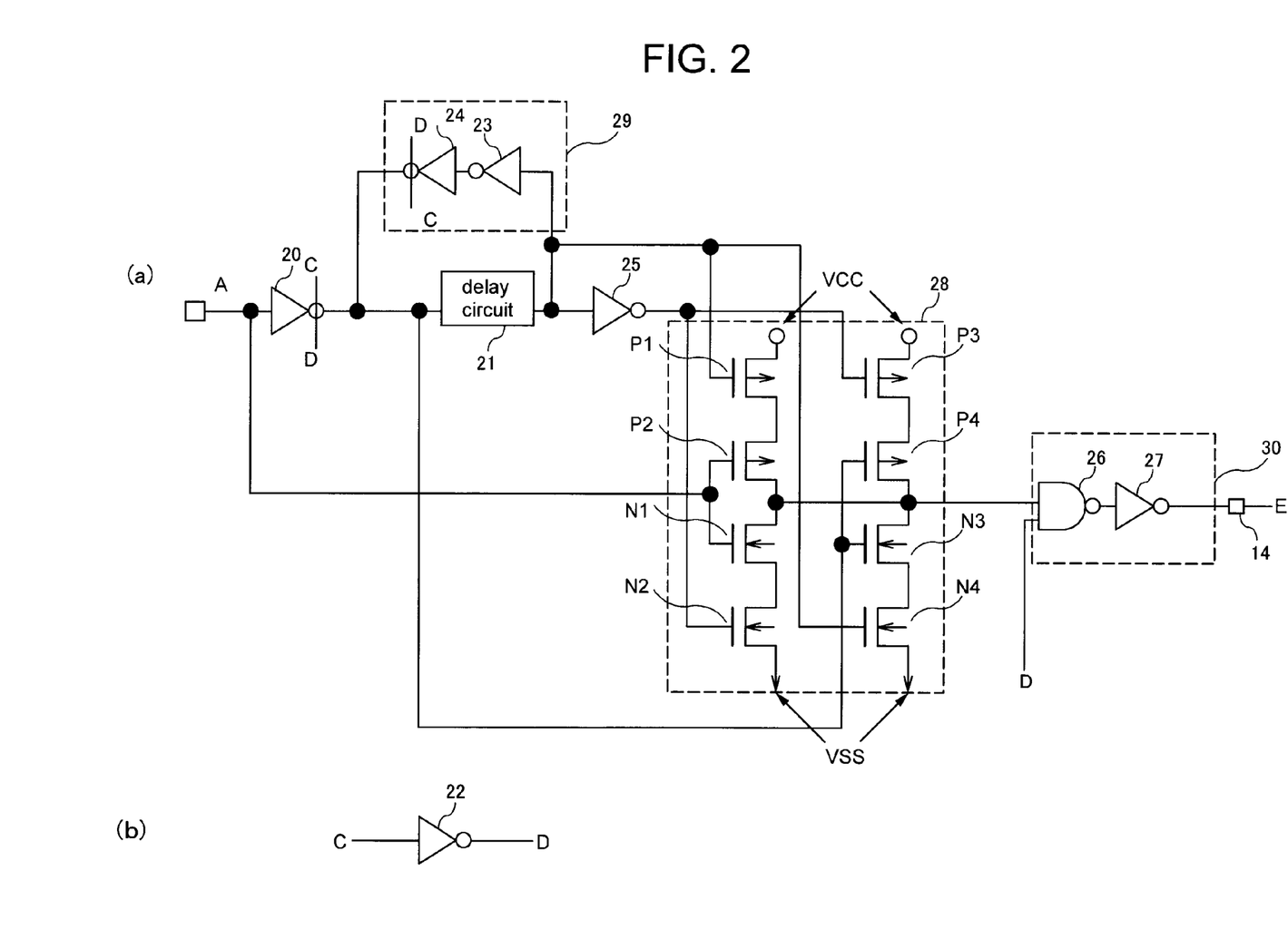

The output of the delay circuit 21 is returned to the input by the feedback circuit 29. One example circuit construction of the feedback circuit 29 is as shown in FIG. 2. The inverter 23 and the clocked inverter 24 are connected in succession. The control signal C and the inverted control signal D are supplied to the control terminals of the clocked inverter 24 (In FIG. 3 the terminals supplied the signal c and d), however, their connection relationship is the opposite of that of the clocked inverter 20.

That is, the inverted control signal D is supplied to the inversion control terminal of the clocked inverter 24 and the control signal C is supplied to the control terminal. Therefore, because the signal C is L and the signal D is H during the asynchronous operation, the clocked inverter 24 does not operate as an inverter and the output is a high-impedance state. And because the C signal is H and the D signal is L during the synchronous operation the clocked inverter 24 operates as an inverter. In this way, the output of the delay circuit 21 is fed back positively to the input and the delay circuit 21 and the feedback circuit 29 comprise a latch circuit.

The input of the inverter 25 is connected to the output of the delay circuit 21. The output of the delay circuit 21, the output of the inverter 25, the input signal and the output of the clocked inverter 20 are each supplied to the signal generation circuit 28.

The signal generation circuit 28 is comprised of P type MOS transistors P1, P2, P3 and P4 and N type MOS transistors N1, N2, N3 and N4. The P type MOS transistors P1 and P2 and the N type MOS transistors N1 and N2 are connected in series between the power terminal and the ground terminal. Also, the P type MOS transistors P3 and P4 and the N type MOS transistors N3 and N4 are connected in series between the power terminal and the ground terminal. The gate of the P type MOS transistor P2 and the gate of the N type MOS transistor N1 are commonly connected and an input signal is supplied. The gate of the P type MOS transistor P1 and the gate of the N type MOS transistor N4 are commonly connected and connected to the output of the delay circuit 21. The gate of the P type MOS transistor P4 and the gate of the N type MOS transistor N3 are commonly connected and connected to the output of the clocked inverter 20. The gate of the P type MOS transistor P3 and the gate of the N type MOS transistor N2 are commonly connected and connected to the output of the inverter 25. The common connection terminal of the P type MOS transistor P2 and the N type MOS transistor N1 and the common connection terminal of the P type MOS transistor P4 and the N type MOS transistor N3 are commonly connected the output of the signal generation circuit 28.

The output fixed circuit 30 is comprised of the 2-input NAND gate 26 and a inverter 27 which are connected in succession. The output of the signal generation circuit 28 is connected to one input terminal of the 2-input NAND gate 26 and the signal D is supplied to the another input terminal. The output of the output fixed circuit 30 is connected to a driver 14.

The operation of the circuit in FIG. 2 is explained below.

(During the Asynchronous Operation)

Firstly, the operation of the circuit during the asynchronous operation is explained. Because the signal C is L and the signal D is H during the asynchronous operation, the clocked inverter 20 operates the same as a usual inverter. On the other hand, the output of the feedback circuit 29 is a high-impedance state.

The input signal A is assumed to be an L state (input L state).

Because the input signal A is L the output of the clocked inverter 20 is H, the output of the delay circuit 21 is also H and the output of the inverter 25 is L. Then, the P type MOS transistor P1 is OFF, the P type MOS transistor P2 is ON, the P type MOS transistor P3 is ON, the P type MOS transistor P4 is OFF, the N type MOS transistor N1 is OFF, the N type MOS transistor N2 is OFF, the N type MOS transistor N3 is ON, and the N type MOS transistor N4 is ON. In this way, because the N type MOS transistors N3 and N4 are both ON the output of the signal generation circuit 28 is L and the output signal E of the driver 14 also is L.

The circuit in FIG. 2 operates as described below when the input signal A shifts from L to H (input L-H shift state).

Because the input signal A is L the output of the clocked inverter 20 is H, however, the output of the delay circuit 21 remains at H. Therefore, the output of the inverter 25 is L. Then, the P type MOS transistor P1 is OFF, the P type MOS transistor P2 is OFF, the P type MOS transistor P3 is ON, the P type MOS transistor P4 is ON, the N type MOS transistor N1 is ON, the N type MOS transistor N2 is OFF, the N type MOS transistor N3 is OFF, and the N type MOS transistor N4 is ON. In this way, because the P type MOS transistors P3 and P4 are both ON the output of the signal generation circuit 28 is H and the output signal E of the driver 14 also is H.

The circuit in FIG. 2 operates as described below when a period of time equivalent to the delay time in the delay circuit 21 has elapsed (input H state).

Because the input signal A is H the output of the clocked inverter 20 is L, the L of the output of the delay circuit 21 becomes H and the output of the inverter 25 becomes H. Then, the P type MOS transistor P1 is ON, the P type MOS transistor P2 is OFF, the P type MOS transistor P3 is OFF, the P type MOS transistor P4 is ON, the N type MOS transistor N1 is ON, the N type MOS transistor N2 is ON, the N type MOS transistor N3 is OFF, and the N type MOS transistor N4 is OFF. In this way, because the N type MOS transistors N1 and N2 are both ON the output of the signal generation circuit 28 is L and the output signal E of the driver 14 also is L.

In this way, when the input signal A shifts from L to H, a pulse signal having duration which is equivalent to the delay time of the delay circuit 21 is output from the driver 14.

The circuit in FIG. 2 operates as described below when the input signal A shifts from H to L (input H-L shift state).

Because the input signal A is L the output of the clocked inverter 20 is H, however, the output of the delay circuit 21 remains at H. Therefore, the output of the inverter 25 is H. Then, the P type MOS transistor P1 is ON, the P type MOS transistor P2 is ON, the P type MOS transistor P3 is OFF, the P type MOS transistor P4 is OFF, the N type MOS transistor N1 is OFF, the N type MOS transistor N2 is ON, the N type MOS transistor N3 is ON, and the N type MOS transistor N4 is OFF. In this way, because the P type MOS transistors P1 and P2 are both ON the output of the signal generation circuit 28 is H and the output signal E of the driver 14 also is H.

The circuit in FIG. 2 operates as described below when a further period of time equivalent to the delay time in the delay circuit 21 has elapsed (input H state).

Because the input signal A is L the output of the clocked inverter 20 is H, the output of the delay circuit 21 is H and the output of the inverter 25 is L. Then, the P type MOS transistor P1 is OFF, the P type MOS transistor P2 is ON, the P type MOS transistor P3 is ON, the P type MOS transistor P4 is OFF, the N type MOS transistor N1 is OFF, the N type MOS transistor N2 is OFF, the N type MOS transistor N3 is ON, and the N type MOS transistor N4 is ON. In this way, because the N type MOS transistors N3 and N4 are both ON the output of the signal generation circuit 28 is L and the output signal E of the driver 14 also is L.

In this way, when the input signal A shifts from H to L, a pulse signal having duration which is equivalent to the delay time of the delay circuit 21 is output from the driver 14.

(During the Synchronous Operation)

The operation of the circuit during the synchronous operation will be explained. Because the control signal C is H and the inverted control signal D is L during the synchronous operation, the output of the clocked inverter 20 is in a state of high-impedance. In this case, the output of the feedback circuit 29 is the same level as the output of the delay circuit 21. Further, because the feedback circuit 29 and the delay circuit 21 comprise a latch circuit, the output of the delay circuit 21 depends on the state just before that. Consequently, the operations of the circuit in FIG. 2 with respect to each case of the output signal level of the delay circuit are explained below.

(The Case where the Input Signal A is L and the Output Signal of the Delay Circuit 21 is L)

The output of the inverter 25 is H. Thus, the P type MOS transistor P1 is ON, the P type MOS transistor P2 is ON, the P type MOS transistor P3 is OFF, the P type MOS transistor P4 is ON, the N type MOS transistor N1 is OFF, the N type MOS transistor N2 is ON, the N type MOS transistor N3 is OFF, and the N type MOS transistor N4 is OFF. In this way, because the P type MOS transistors P1 and P2 are both ON the output of the signal generation circuit 28 is H and the output signal E of the driver 14 is L by the output fixed circuit 30.

(The Case where the Input Signal A is L and the Output Signal of the Delay Circuit 21 is H)

The output of the inverter 25 is L. Thus, the P type MOS transistor P1 is OFF, the P type MOS transistor P2 is ON, the P type MOS transistor P3 is OFF, the P type MOS transistor P4 is OFF, the N type MOS transistor N1 is ON, the N type MOS transistor N2 is OFF, the N type MOS transistor N3 is ON, and the N type MOS transistor N4 is ON. In this way, because the N type MOS transistors N3 and N4 are both ON the output of the signal generation circuit 28 is L and the output signal E of the driver 14 is L by the output fixed circuit 30.

(The Case where the Input Signal A is H and the Output Signal of the Delay Circuit 21 is L)

The output of the inverter 25 is H. Thus, the P type MOS transistor P1 is ON, the P type MOS transistor P2 is OFF, the P type MOS transistor P3 is OFF, the P type MOS transistor P4 is ON, the N type MOS transistor N1 is ON, the N type MOS transistor N2 is ON, the N type MOS transistor N3 is OFF, and the N type MOS transistor N4 is OFF. In this way, because the N type MOS transistors N1 and N2 are both ON the output of the signal generation circuit 28 is L and the output signal E of the driver 14 is L by the output fixed circuit 30.

(The Case where the Input Signal A is H and the Output Signal of the Delay Circuit 21 is H)

The output of the inverter 25 is L. Thus, the P type MOS transistor P1 is OFF, the P type MOS transistor P2 is OFF, the P type MOS transistor P3 is ON, the P type MOS transistor P4 is OFF, the N type MOS transistor N1 is ON, the N type MOS transistor N2 is OFF, the N type MOS transistor N3 is ON, and the N type MOS transistor N4 is ON. In this way, because the N type MOS transistors N3 and N4 are both ON the output of the signal generation circuit 28 is L and the output signal E of the driver 14 is L by the output fixed circuit 30.

In this way, even if the input signal A shifts from L to H or from H to L during the synchronous operation, the output signal E is fixed at L by the output fixed circuit 30. In the synchronous state, because the output of the clocked inverter 20 is in a state of high impedance, a through current does not flow in the delay circuit 21. Thus, a reduction of power consumption in the delay circuit 21 is possible.

Figure 4:
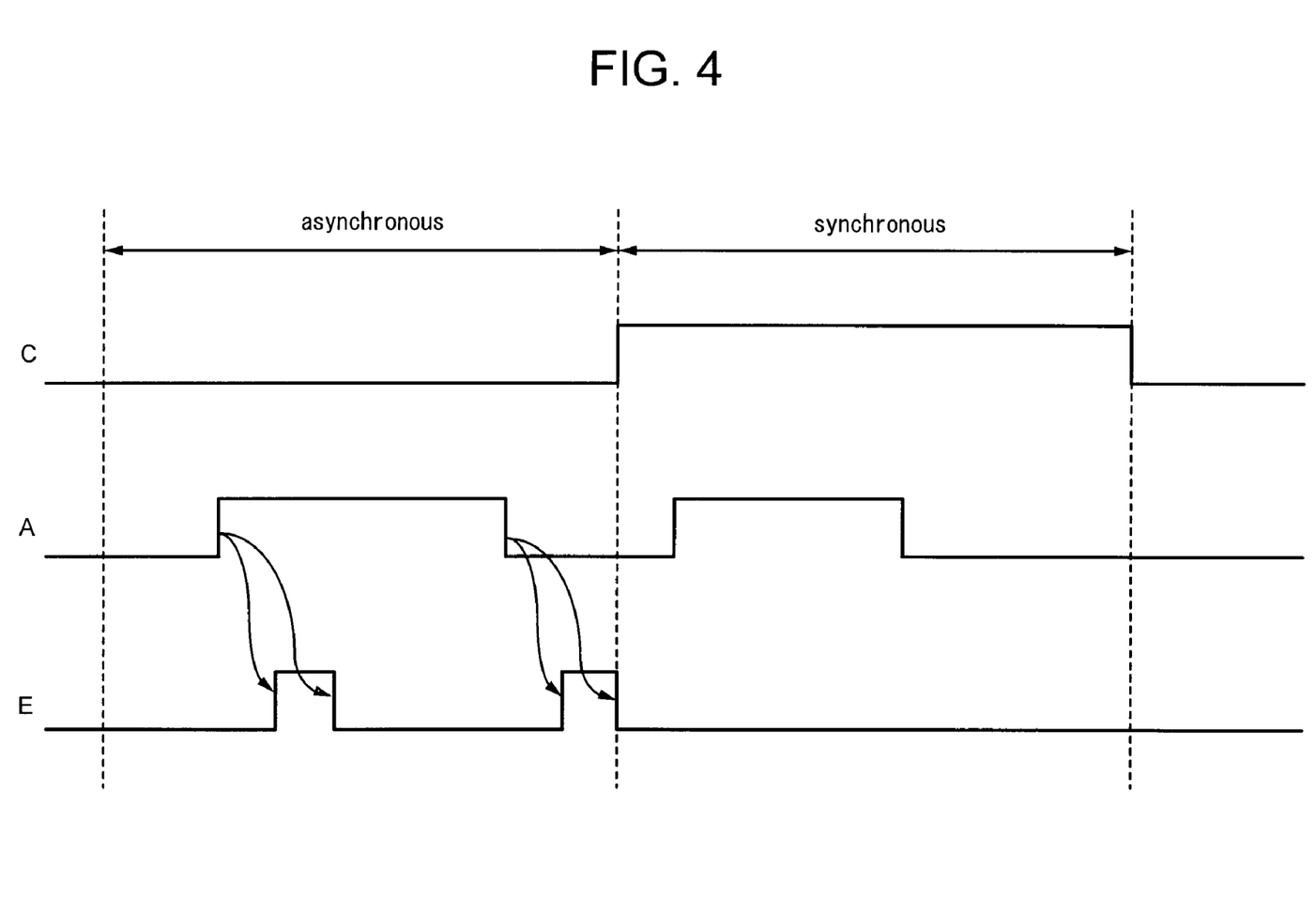
FIG. 4 is one example of a timing chart of an input detection circuit of the present invention.

The circuit operation as described above is shown on a timing chart expressed with a time axis in FIG. 4.

The signal C is a control signal which is generated by the control circuit. The control signal C is H during the synchronous operation and L during the asynchronous operation. When the semiconductor device changes from the asynchronous operation to the synchronous operation, the control signal C shifts from L to H and when it changes from the synchronous operation to the asynchronous operation, the control signal C shifts from H to L. When an input signal is input to the input terminal during the asynchronous operation, the output signal E is output from the driver 14 via the input detection circuit in accordance with the input signal. At this time, a pulse signal having duration equivalent to the delay time of the delay circuit 21 is output from the driver 14. Alternatively, when an input signal is input to the input terminal A during the asynchronous operation, the output signal E which is output from the driver 14 is fixed at L by the output fixed circuit.

Figure 5:
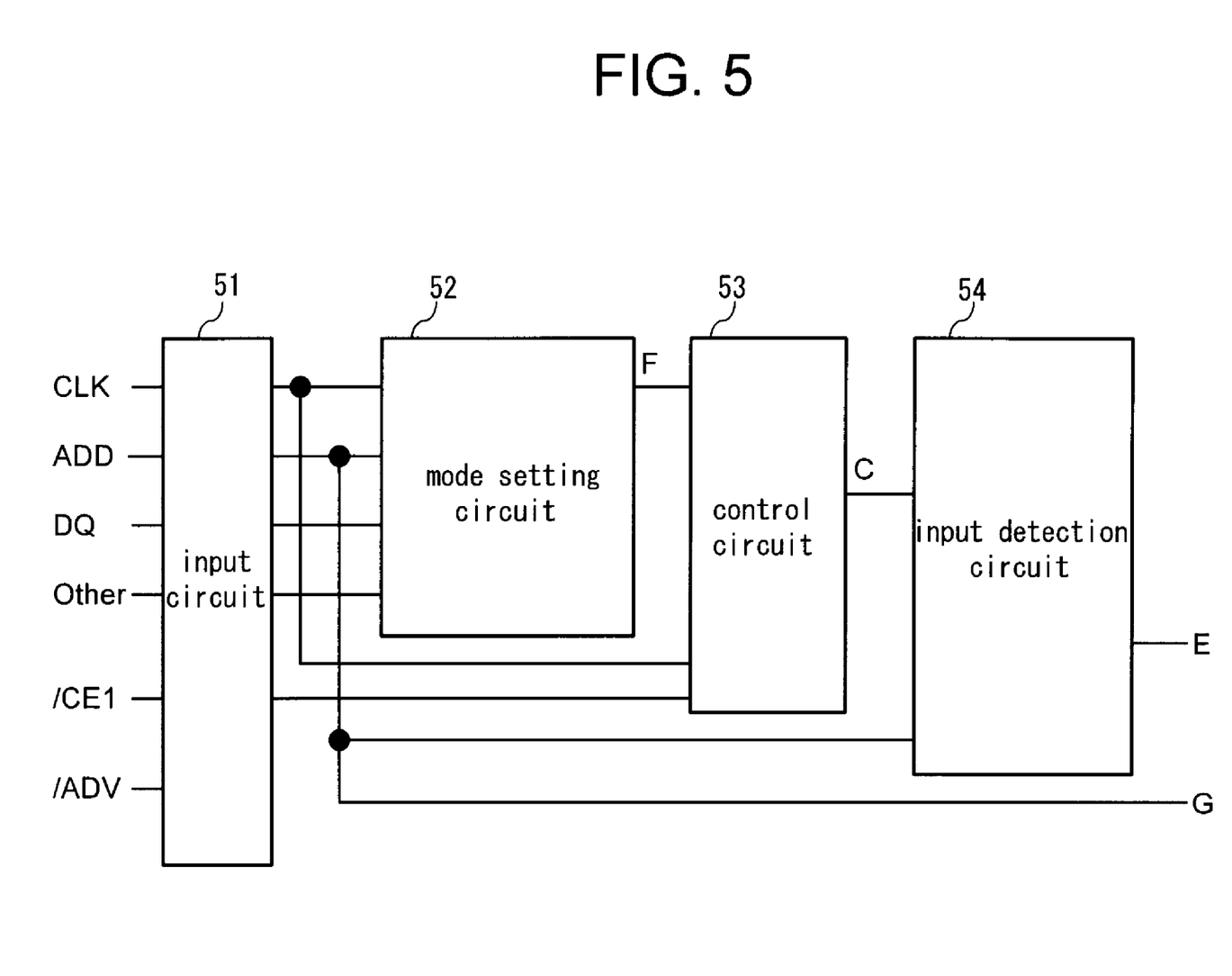
FIG. 5 is one example of a block diagram of the area around an input detection circuit of the present invention.

FIG. 5 is a block diagram of one example of a circuit of pseudo SRAM (pseudo SRAM is a memory device which has the internal circuit construction same as DRAM and the input/output interface same as SRAM) which is applied the input detection circuit of the present invention.

This pseudo SRAM includes an input circuit 51, a mode setting circuit 52, a control circuit 53 and an input detection circuit 54.

An external clock signal CLK, an external address signal ADD, an external data signal DQ and other signals are each supplied to the input circuit and a corresponding internal signal is generated. The internal signal is supplied to the mode setting circuit 52 and the mode setting circuit 52 judges whether the operation mode is either synchronous or asynchronous in response to these internal signals. If the operation mode is synchronous an output signal F of the mode setting circuit 52 is a level H and if the operation mode is asynchronous the output signal F is a level L. An external chip selection signal /CE1 and an external address effective signal /ADV also similarly are supplied to the input circuit and a corresponding internal signal is generated.

The control circuit 53 operates in accordance with an internal clock signal, an output signal F and an internal chip selection signal. Even if the operation mode is synchronous, when the supply of the clock signal CLK is stopped, the control signal C is generated which instructs the asynchronous operation. The control signal C is supplied to the input detection circuit 54 and the input detection circuit 54 has the same circuit construction as the input detection circuit 13 in FIG. 1.

Figure 6:
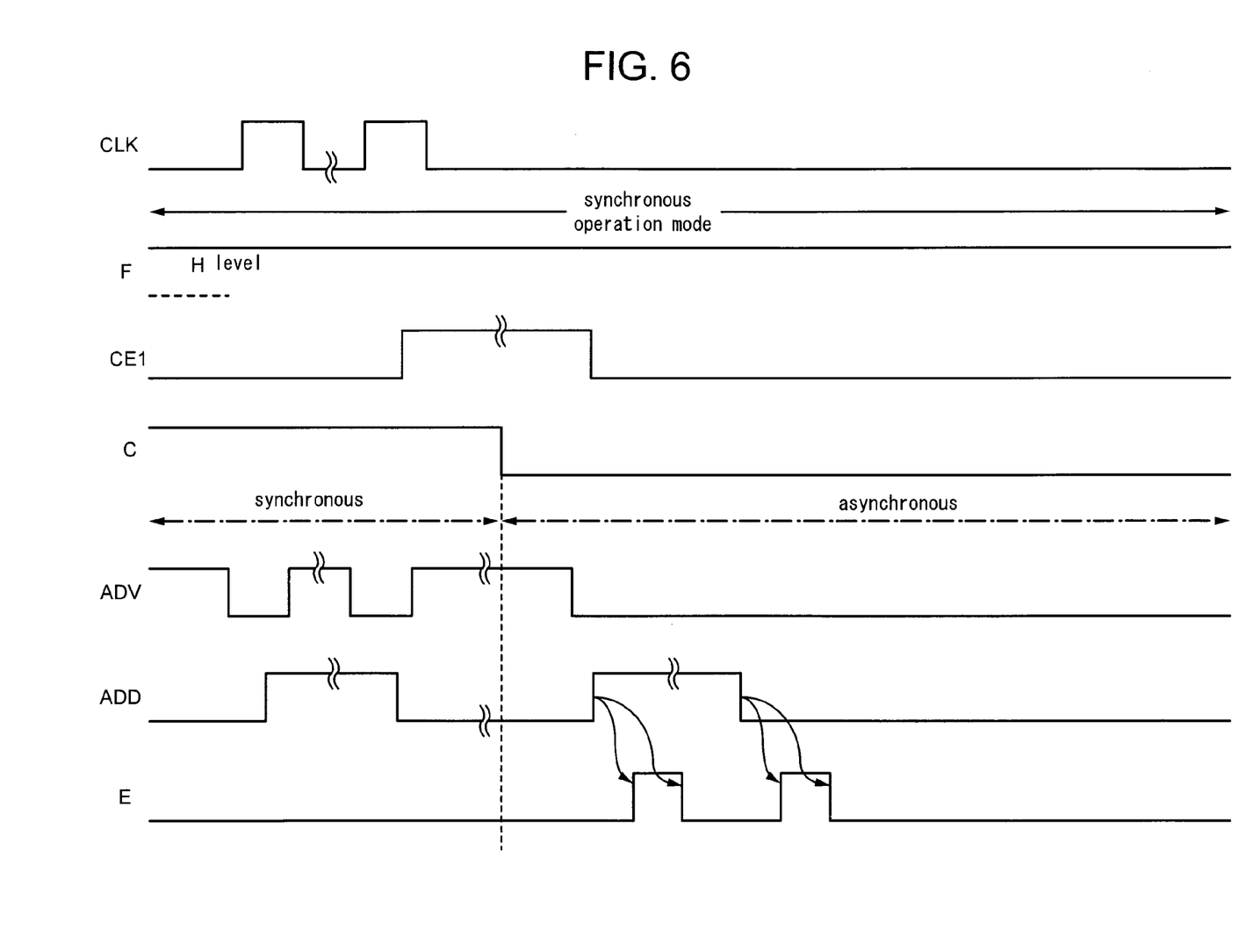
FIG. 6 is one example of a timing chart which corresponds to an interruption of an asynchronous operation during a synchronous operation using the present invention.

FIG. 6 is a one example of a timing chart which corresponds to the interruption of the asynchronous operation during the synchronous operation in the present invention. As previously stated, /CE1 is an external signal for selecting a chip and /ADV is an external signal for retrieving ADD. During the synchronous operation, the device is activated by the external clock signal CLK and because the output signal E is fixed, even if the external signal address ADD is input, the output signal E does not shift. When the external chip selection signal /CE1 shifts to H during the synchronous operation, the controls signal C becomes L (it instructs the asynchronous operation mode), and the asynchronous operation may be started by stopping the supply of the external clock signal CLK and shifting the external chip selection signal /CE1 to L.

Also, during the asynchronous operation, the external chip selection signal /CE1 is in an L state and after the external address effective signal /ADV shifts to L, when the external clock signal CLK is supplied, the synchronous operation may be started by shifting the control signal C to H (it instructs the synchronous operation mode). The output signal E is controlled by either activating or not activating the input detection circuit corresponding to the either the synchronous operation mode or the asynchronous operation mode and a reduction is current is possible.

In addition, by adjusting the channel width of the MOS transistors which are connected in series and which comprise the signal generation circuit 28, it is possible to speed up the operation of the signal generation circuit 28 and the operation of the two inputs NAND gate in these input detection circuits 13 and 54.

Among the P type MOS transistors P1, P2 and the N type MOS transistors N1, N2 and the P type MOS transistors P3, P4 and the N type MOS transistors N3, N4, which are connected in series within the signal generation circuit, by enlarging the width of the transistor channel which is connected to the power side and/or the ground side, it is possible to make each ON resistance of the P type MOS transistors P1, P3 and the N type MOS transistors N2, N4 smaller. And it is possible to make the series resistance of transistors which are connected in series smaller. Also, there is no reduction in charging current within each transistor. In this case, because the diffusion capacity of the P type MOS transistors P2, P4 or the N type MOS transistors N1, N3 does not increase, it is possible to shorten charging time and, it is possible to reduce the delay time until the output signal is output after the input signal is input to the input detection circuit.

Figure 7:
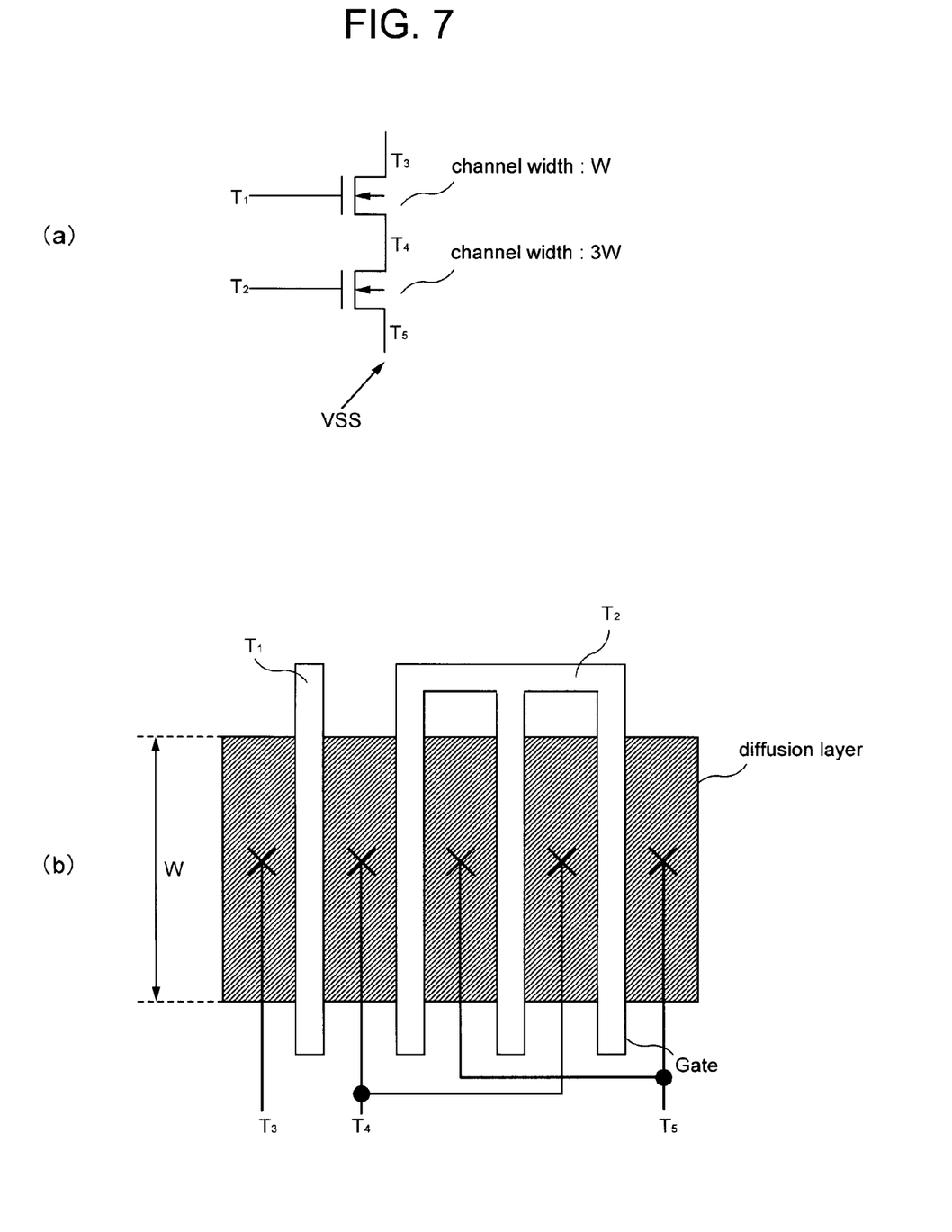
FIG. 7 is one example of layout of a MOS transistor.
Figure 8:
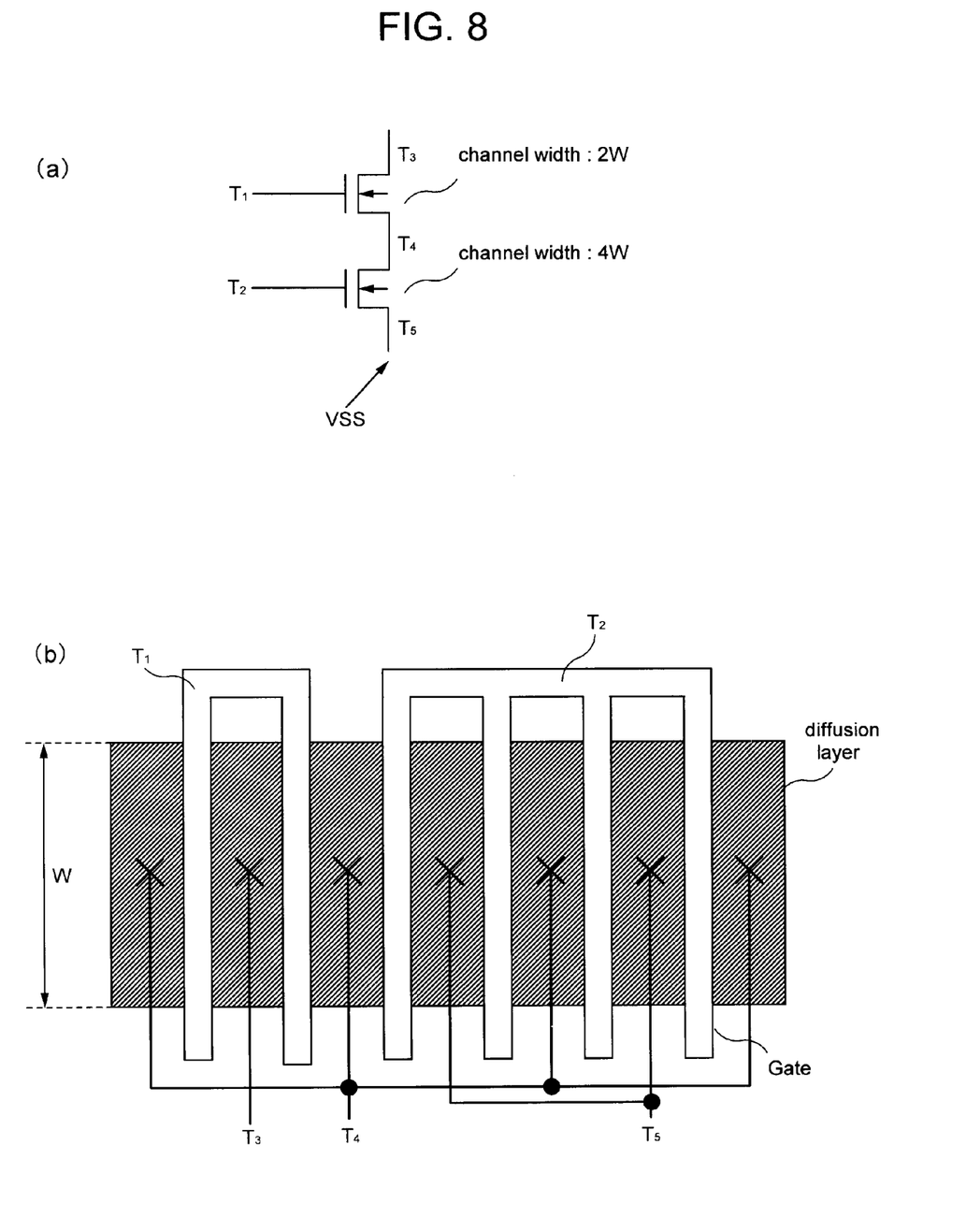
FIG. 8 is one example of layout of a MOS transistor.

In this case, by making the width of the MOS transistor channel which is connected to the power side and/or the ground side into an integral multiple of the width of the channel of the MOS transistor which is connected to neither the power side or the ground side, it is possible to reduce the layout of each transistor. FIG. 7 and FIG. 8 are each an example of the layout when the width of the MOS transistor channel which is connected to the ground side has been made an integral multiple of the width of the channel of the MOS transistor which is connected to neither the power side or the ground side. FIG. 7 is a layout, in N type MOS transistors which are connected in series, when the width of the channel of the transistors (N type MOS transistors N2, N4) which are connected to the ground side has been made three times the width of the channel of the transistors (N type MOS transistors N1, N3) which are not connected to the ground side. FIG. 8 is a layout when the width of the channel of the transistors which are not connected to the ground side is made twice the width of the channel of the transistors which are not connected to the ground side shown in FIG. 7(*a*) and when the width of the channel of the transistors which are connected to the ground side is further made twice the width of the channel of the transistors which are not connected to the ground side. The same can be said of the power side.

By constructing in this way, it is possible to omit an element insulation region between adjacent transistors. And by setting a channel width at an integral multiple it is possible to use a diffusion layer of the same width and reduce layout size.

In one embodiment of the input detection circuit of the present invention, by changing the width of a channel of MOS transistors which are connected in series and which comprise the signal generation circuit, it is possible to speed up the signal generation circuit.

In one embodiment of the input detection circuit of the present invention, in the signal generation circuit, by making the width of a channel of MOS transistors which are connected to a power side and/or ground side and which are connected in series into integral multiple of the width of a channel transistors which are connected neither to a power side or ground side, it is possible to speed up the signal generation circuit.

The present invention is explained using the examples described above, however, the present invention can be changed and adjusted within range.

What is claimed is:

1. A semiconductor device comprising:
    a first input terminal, said first input terminal being supplied with an input signal;
    an input detection circuit including a delay circuit having a second input terminal and an output terminal, said input detection circuit detecting a shift in said input signal and generating a first pulse signal in response to said shift, said input detection circuit being connected to said first input terminal; and
    a control circuit for generating control signals, each of said control signals being generated in response to a synchronous operation or an asynchronous operation respectively.

2. The semiconductor device according to claim 1, wherein said input detection circuit further includes a signal generation circuit which is connected to said second input terminal and said output terminal and generates a second pulse signal, and a first gate circuit which is connected between said first input terminal and said second input terminal does not transmit said input signal supplied from said first input terminal to said second input terminal when said control signal is generated in response to said synchronous operation.

3. The semiconductor device according to claim 2, wherein said first gate circuit is a clocked inverter.

4. The semiconductor device according to claim 1, wherein said input detection circuit further includes a feedback circuit, said feedback circuit being supplied with an first output signal output from said output terminal and outputting a second output signal to said second input terminal when said control signal is generated in response to said synchronous operation and not outputting said second output signal to said second input terminal when said control signal is generated in response to said asynchronous operation.

5. The semiconductor device according to claim 4, wherein said feedback circuit includes a second gate circuit which is connected between said output terminal and said second input terminal does not transmit a signal when said control signal generated in response to said asynchronous operation and transmits said signal when said control signal generated in response to said synchronous operation.

6. The semiconductor device according to claim 5, wherein said second gate circuit is a clocked inverter.

7. The semiconductor device according to claim 1, wherein said input detection circuit further includes a third gate circuit which fixes a third output signal output from said signal generation circuit at a predetermined level when said control signal is generated in response to said synchronous operation.

8. The semiconductor device according to claim 7 further comprising:
    an inverter for generating an inverted control signal by inverting said control signal and for supplying said inverted control signal to said third gate circuit.

9. A semiconductor device comprising:
    a first input terminal, said first input terminal being supplied with an input signal;
    an input detection circuit including a delay circuit having a second input terminal and an output terminal and a signal generation circuit connected to said second input terminal and said output terminal, said signal generation circuit generating a first pulse signal, said input detection circuit detecting a shift in said input signal and generating a second pulse signal in response to said shift, said input detection circuit being connected to said input terminal; and a control circuit for generating control signals, each of said control signals being generated in response to a synchronous operation or an asynchronous operation respectively.

10. The semiconductor device according to claim 9, wherein said input detection circuit further includes a first gate circuit which is connected between said first input terminal and said second input terminal does not transmit said input signal supplied from said first input terminal to said second input terminal when said control signal is generated in response to said synchronous operation.

11. The semiconductor device according to claim 10, wherein said first gate circuit is a clocked inverter.

12. The semiconductor device according to claim 9, wherein said input detection circuit further includes a feedback circuit, said feedback circuit being supplied with an first output signal output from said output terminal and outputting a second output signal to said second input terminal when said control signal is generated in response to said synchronous operation and not outputting said second output signal to said second input terminal when said control signal is generated in response to said asynchronous operation.

13. The semiconductor device according to claim 12, wherein said feedback circuit includes a second gate circuit which is connected between said output terminal and said second input terminal does not transmit a signal when said control signal is generated in response to said asynchronous operation and transmits said signal when said control signal is generated in response to said synchronous operation.

14. The semiconductor device according to claim 13, wherein said second gate circuit is a clocked inverter.

15. The semiconductor device according to claim 9, wherein said input detection circuit further includes a third gate circuit which fixes a third output signal output from said signal generation circuit at a predetermined level when said control signal is generated in response to said synchronous operation.

16. The semiconductor device according to claim 15 further comprising:

an inverter for generating an inverted control signal by inverting said control signal and for supplying said inverted control signal to said third gate circuit.

17. The semiconductor device according to claim 9, wherein said signal generation circuit includes a plurality of transistors connected in series.

18. The semiconductor device according to claim 17, wherein said plurality of transistors includes a plurality of PMOS transistors which are connected to a power side and a plurality of NMOS transistors which are connected to a ground side.

19. The semiconductor device according to claim 18, wherein a channel width of a transistor which is connected to a power and/or ground side is greater than the width of a channel of a transistor which is connected neither to a power side or a ground side among said plurality of PMOS transistors and said plurality of NMOS transistors.

20. The semiconductor device according to claim 19, wherein a channel width of a transistor which is connected to a power and/or ground side is an integral multiple of the width of a channel of a transistor which is connected neither to a power side or a ground side among said plurality of PMOS transistors and said plurality of NMOS transistors.

* * * * *